United States Patent
Jo

(10) Patent No.: US 12,061,224 B2
(45) Date of Patent: Aug. 13, 2024

(54) DIAGNOSIS CIRCUIT OF PARALLEL-STRUCTURE MOSFETS INCLUDING MUX AND DIAGNOSIS METHOD USING THE SAME

(71) Applicant: LG Energy Solution, Ltd., Seoul (KR)

(72) Inventor: Lyang Wook Jo, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 255 days.

(21) Appl. No.: 17/615,184

(22) PCT Filed: Nov. 20, 2020

(86) PCT No.: PCT/KR2020/016493
§ 371 (c)(1),
(2) Date: Nov. 30, 2021

(87) PCT Pub. No.: WO2021/101322
PCT Pub. Date: May 27, 2021

(65) Prior Publication Data
US 2022/0229104 A1    Jul. 21, 2022

(30) Foreign Application Priority Data

Nov. 21, 2019  (KR) .................. 10-2019-0150213
Nov. 21, 2019  (KR) .................. 10-2019-0150214
Nov. 19, 2020  (KR) .................. 10-2020-0155900

(51) Int. Cl.
*G01R 31/26*  (2020.01)
*G01R 31/27*  (2006.01)
*H01M 10/42*  (2006.01)

(52) U.S. Cl.
CPC ......... *G01R 31/2621* (2013.01); *G01R 31/27* (2013.01); *H01M 10/42* (2013.01)

(58) Field of Classification Search
CPC .......................... G01R 31/2621; G01R 31/27; G01R 31/3277; G01R 31/00; B60W 50/0205;
(Continued)

(56) References Cited

U.S. PATENT DOCUMENTS

2007/0139841 A1   6/2007  Ohshima
2009/0243546 A1   10/2009  Sakurai et al.
(Continued)

FOREIGN PATENT DOCUMENTS

JP   2000245054 A   9/2000
JP   2000293201 A   10/2000
(Continued)

OTHER PUBLICATIONS

Translation of KR20160041495A (Year: 2016).*
(Continued)

*Primary Examiner* — Christopher P McAndrew
(74) *Attorney, Agent, or Firm* — Lerner David LLP

(57) ABSTRACT

A circuit and diagnosis method capable of individually diagnosing abnormality of a plurality of internal FETs constituting a MOSFET provided between a secondary battery pack and an electric vehicle. Voltage at both ends of each of the internal FETs is measured while individually turning ON/OFF the internal FETs, and is compared with a diagnosis table in order to determine abnormality thereof.

13 Claims, 4 Drawing Sheets

(58) Field of Classification Search
CPC ............. H01M 10/42; H01M 2220/20; H01M 10/425; H01M 10/4285
USPC .................................................. 324/762.09
See application file for complete search history.

(56) References Cited

U.S. PATENT DOCUMENTS

| | | | |
|---|---|---|---|
| 2012/0049931 | A1 | 3/2012 | Yamada |
| 2015/0260781 | A1* | 9/2015 | Plavec ............. H03K 19/00369 324/762.09 |
| 2016/0109505 | A1* | 4/2016 | Capodivacca ..... G01R 31/2621 324/762.09 |
| 2017/0192049 | A1 | 7/2017 | Tavernier et al. |
| 2017/0363676 | A1* | 12/2017 | Shapiro ............. G01R 31/2621 |
| 2018/0233903 | A1 | 8/2018 | Murakami et al. |
| 2019/0252908 | A1 | 8/2019 | Takita et al. |
| 2019/0293710 | A1* | 9/2019 | Nakazato ........... G01R 31/2621 |
| 2019/0379217 | A1 | 12/2019 | Song et al. |

FOREIGN PATENT DOCUMENTS

| | | | |
|---|---|---|---|
| JP | 2001174531 | A | 6/2001 |
| JP | 2012054694 | A | 3/2012 |
| JP | 5032378 | B2 | 9/2012 |
| JP | 5526965 | B2 | 6/2014 |
| JP | 201595442 | A | 5/2015 |
| JP | 2015103893 | A | 6/2015 |
| JP | 2018078701 | A | 5/2018 |
| JP | 2018133599 | A | 8/2018 |
| JP | 2018143073 | A | 9/2018 |
| JP | 2019168309 | A | 10/2019 |
| KR | 19900012828 | U | 7/1990 |
| KR | 101076764 | B1 | 10/2011 |
| KR | 20160041495 | A | 4/2016 |
| KR | 20170012378 | A | 2/2017 |
| KR | 20190034805 | A | 4/2019 |
| KR | 20190034888 | A | 4/2019 |

OTHER PUBLICATIONS

Translation of International Preliminary Report on Patentability. (Year: 2019).*
Extended European Search Report for Application No. 20889077.2 dated Aug. 25, 2022. 6 pgs.
International Search Report for Application No. PCT/KR2020/016493 mailed Mar. 8, 2021, pp. 1-3.

* cited by examiner

[FIG. 1]
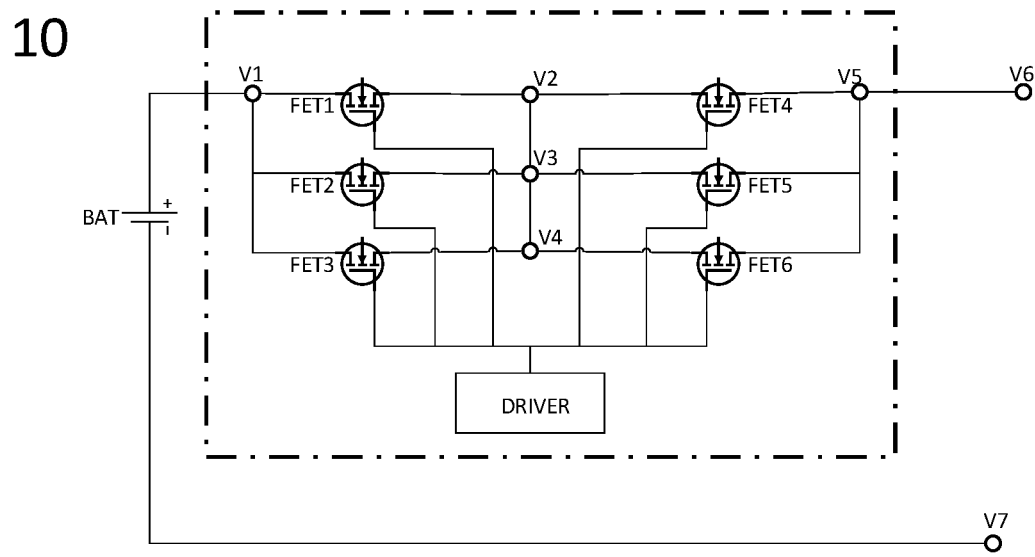

[FIG. 2]
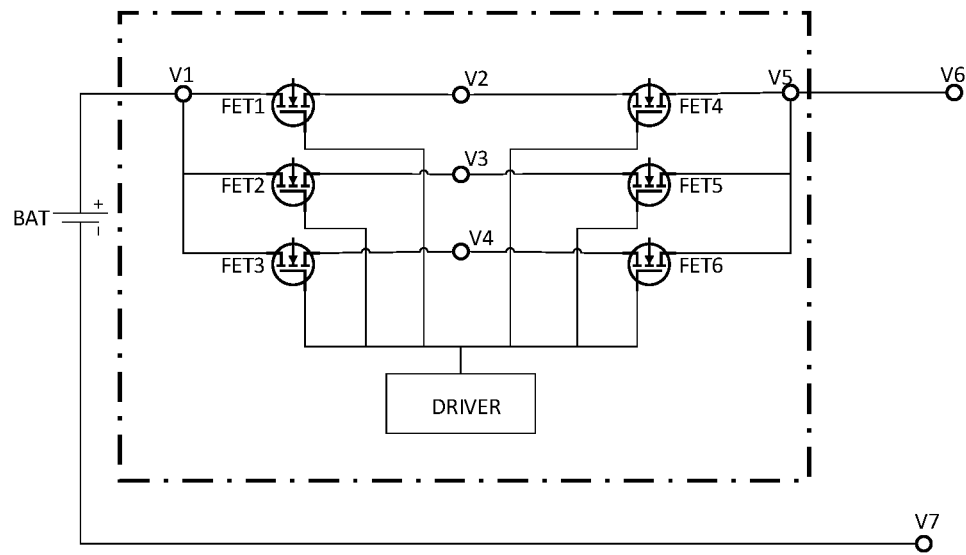

[FIG. 3]
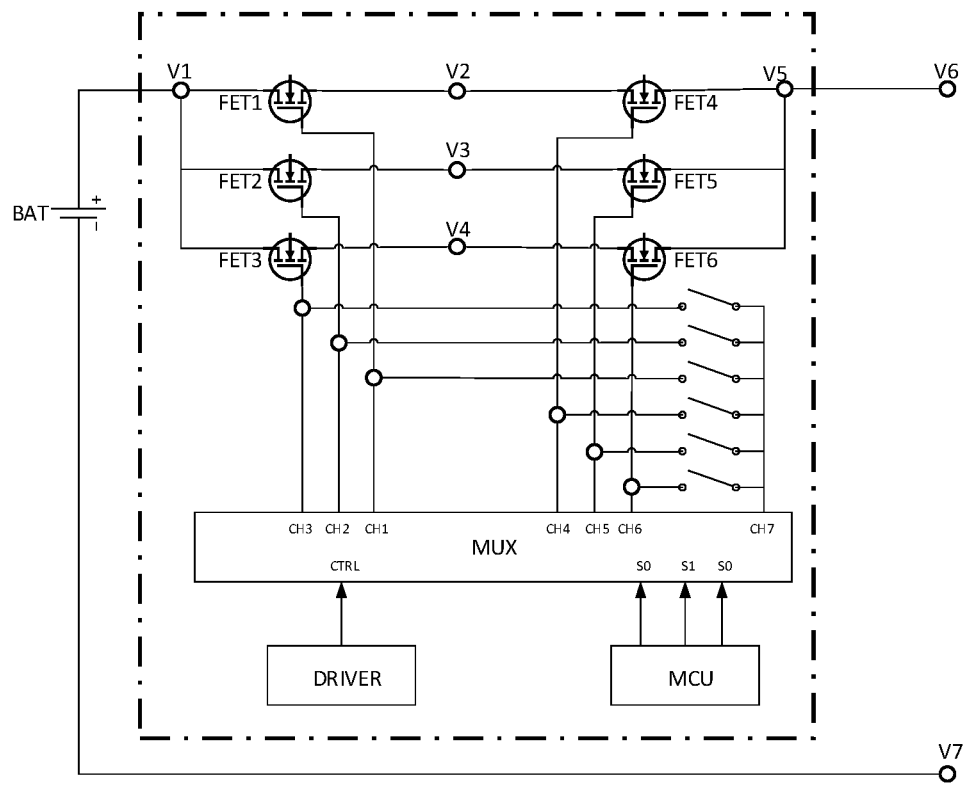

[FIG. 4]
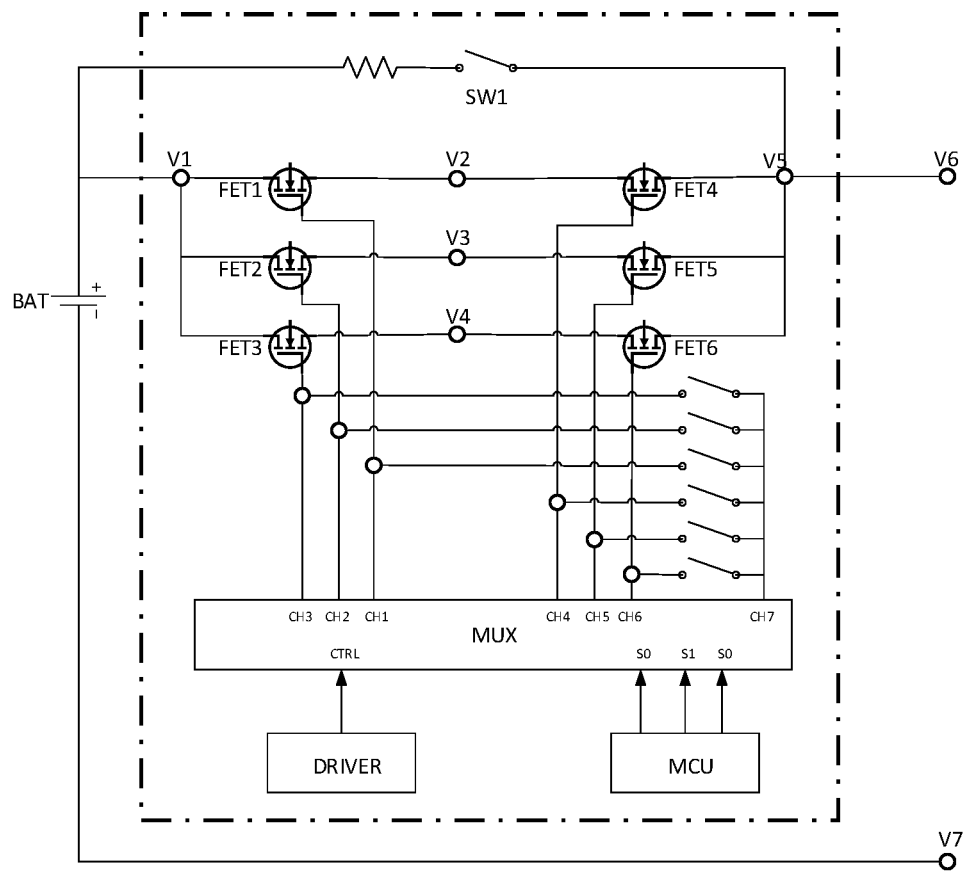

DIAGNOSIS CIRCUIT OF PARALLEL-STRUCTURE MOSFETS INCLUDING MUX AND DIAGNOSIS METHOD USING THE SAME

CROSS-REFERENCE TO RELATED APPLICATIONS

The present application is a national phase entry under 35 U.S.C. § 371 of International Application No. PCT/KR2020/016493 filed Nov. 20, 2020, published in Korean, which claims priority from Korean Patent Application Nos. 10-2019-0150213 filed Nov. 21, 2019; 10-2019-0150214 filed Nov. 21, 2019; and 10-2020-0155900 filed Nov. 19, 2020; all of which are incorporated herein by reference.

TECHNICAL FIELD

This application claims the benefit of priority to Korean Patent Application No. 2019-0150213 filed on Nov. 21, 2019, Korean Patent Application No. 2019-0150214 filed on Nov. 21, 2019, and Korean Patent Application No. 2020-0155900 filed on Nov. 19, 2020, the disclosures of which are hereby incorporated by reference herein their entirety.

The present invention relates to a diagnosis circuit of parallel-structure MOSFETs including a multiplexer (MUX) and a diagnosis method using the same. More particularly, the present invention relates to a circuit capable of diagnosing failure of a specific MOSFET, among a plurality of MOSFETs configured to supply power to a vehicle, the MOSFETs being connected to each other in parallel, using a MUX and a method of diagnosing failure of a specific MOSFET, among a plurality of MOSFETs connected to each other in parallel, using the same.

BACKGROUND ART

With development of an electric vehicle (EV), a hybrid electric vehicle (HEV), and a plug-in hybrid electric vehicle (Plug-In HEV), demand for lithium secondary batteries is expected to continuously increase. A secondary battery applicable to an electric vehicle is generally used in a configuration in which a plurality of secondary battery cells is assembled. A secondary battery pack having a multi-module structure in which a plurality of secondary battery cells is connected to each other in series/parallel is generally used.

A secondary battery pack is provided as an apparatus separate from an electric vehicle. A relay for electrical ON/OFF connection is provided between the secondary battery pack and the electric vehicle.

12 V, 48 V, or 400 V are generally used as voltages supplied by a secondary battery pack for vehicles. For 400 V, a mechanical relay is used due to physical limitation. For lower voltages, however, an FET, which is an electrical scheme, has been rapidly used as an alternative.

The mechanical relay has advantages in that the mechanical relay is capable of handling high voltage and a large amount of current, is usable at high temperatures, and is inexpensive. In contrast, noise is generated due to contact with contact points at the time of ON/OFF, and the lifespan of the mechanical relay is limited due to sparks generated at the time of contact with the contact points. In addition, the mechanical relay has a disadvantage in that the mechanical relay has low resistance to physical impact due to internal mechanical components thereof.

When a vehicle comes to a sudden stop or a vehicle crash occurs, very high acceleration of gravity is applied to the vehicle. As a result, the mechanical relay may be damaged. A secondary accident, such as fire, may occur due to such damage and short circuit.

A MOSFET (Metal Oxide Semiconductor Field Effect Transistor) is a representative electrical relay. The MOSFET has disadvantages in that a large amount of heat is generated due to lower capacity and material resistance (RDs) than the mechanical relay. Depending on circumstances, temperature may increase to 200° C. or higher due to resistance.

Although the MOSFET generates heat and is expensive, compared to the mechanical relay, the MOSFET has advantages in that the lifespan of the MOSFET is semi-permanent and the MOSFET is little damaged by physical impact. In many vehicles, therefore, MOSFETs are expected to replace mechanical relays. Noise due to operation of the mechanical relay is also continuously required to be removed, and therefore an electronic relay is expected to be rapidly used first in high-priced vehicles.

As long as problems related to capacity and heat generation are solved, the MOSFET will replace the mechanical relay in an electric vehicle excluding a high-voltage vehicle. Various kinds of research to remove a case from an FET, to directly connect the FET to a metal current collector in order to prevent contact with external air or to increase heat transfer area although there is an oxidation problem due to moisture and oxygen has been conducted.

For MOSFETs applied to some vehicles at present, a plurality of MOSFETs is used in the state of being connected to each other in parallel due to a problem, such as capacity. The plurality of MOSFETs is controlled by a single driver. When actually viewed from outside, a single MOSFET seems to be used for vehicles. In many cases, however, six internal FETs or internal MOSFETs (hereinafter referred to as "internal FETs") having a 2S3P structure (three of two series sets are connected to each other in parallel) are provided. The number of internal FETs may be variously increased, for example, to 6, 10, or 12 depending on required capacity.

As mentioned above, the internal FETs are connected to each other in series and in parallel. To date, no circuit or method capable of determining abnormality of some of the internal FETs has been proposed.

In the case in which some of the internal FETs are damaged and thus continuously connected to each other (fail on), current that flows in a distributed state without flowing through the internal FETs is concentrated on the damaged internal FETs, whereby the damaged internal FETs easily overheat. As a result, the overall system may overheat. Overheating of the battery pack may be a fatal factor in vehicle safety.

FIG. 1 is a connection circuit diagram of conventional MOSFETs for vehicles. Power supplied from a vehicle pack BAT is controlled by an apparently single MOSFET. In FIG. 1, a portion indicated by a dash-single dotted line corresponds to an apparently single MOSFET. Internal FETs shown in FIG. 1 are connected to each other so as to have a 2S3P structure as an example. However, change to various other combinations is possible.

FET1 to FET6 indicate six internal FETs. An N-type MOSFET or a P-type MOSFET is possible as needed. In all figures of the present invention, only N-type MOSFETs are shown; however, substitution of P-type MOSFETs for N-type MOSFETs is easily selectable as needed.

In the case in which no voltage is applied to gates, FET1, FET2, and FET3 are operated differently from FET4, FET5, and FET6. In the case in which voltage is applied to the gates, current may flow through FET1, FET2, and FET3 in a direction from the battery pack to the vehicle (from the left to the right in FIG. 1). In the case in which no voltage is applied to the gates, current flows through diodes in a direction from the vehicle to the battery pack (from the right to the left in FIG. 1). In the case in which voltage is applied to the gates, current may flow through FET4, FET5, and FET6 in the direction from the vehicle to the battery pack, in contrast to FET1, FET2, and FET3. In the case in which no voltage is applied to the gates, current flows through diodes in the direction from the battery pack to the vehicle.

In the case in which no voltage is applied to the gates, all of the FETs are not operated; however, current may flow through separate diodes or internal parasitic diodes in the reverse direction (from the right to the left in FIG. 1) for FET1, FET2, and FET3, and current may flow through separate diodes or internal parasitic diodes in the forward direction (from the left to the right in FIG. 1) for FET4, FET5, and FET6. That is, current may flow in directions from V2, V3, and V4 to V1 for FET1, FET2, and FET3, respectively, and current may flow in directions from V2, V3, and V4 to V5 for FET4, FET5, and FET6, respectively.

The conventional MOSFETs of FIG. 1 are all controlled by a single driver at once. The reason that V2, V3, and V4 are connected to each other in FIG. 1 is that, in the case in which a large amount of current instantaneously flows due to abrupt acceleration or abruption braking of a vehicle, it is necessary to distribute the current to a plurality of internal FETs. The conventional MOSFETs for vehicles are simultaneously turned ON/OFF by a single driver, and there is no method of diagnosing an error of some of the internal FETs.

Patent Documents 1 to 3 have something in common in that these documents relate to technologies for diagnosing failure of a plurality of FETs connected to each other in parallel.

In concrete construction, the construction of Patent Document 1 is complicated in that a voltage value of individually detected resistance of a mirror FET provided at each FET is used and additional maintenance of each individual mirror FET is necessary. Patent Document 2 is partially similar to the above patent document in that a change in voltage value of a load side terminal, i.e. the final output, generated by controlling ON/OFF of a plurality of FETs is measured to diagnose failure. In Patent Document 2, however, no separate power source for detection is used, and therefore a current measurement means necessary for high voltage must be separately provided. In addition, Patent Document 2 does not suggest a solving means, such as a concrete circuit. The construction of Patent Document 3 is complicated in that driving of all FETs is individually controlled, in that a separate resistor for current detection is added to each of the FETs, and in that a plurality of parts is added for maintenance thereof. In addition, failure of the diagnosis circuits themselves may become an issue.

As described above, no effective method capable of diagnosing abnormality of individual FETs of a MOSFET in an electric vehicle having a secondary battery pack has been proposed, and therefore a danger of accident due to MOSFETs, the demand for which will continuously increase from now on, has increased.

Japanese Patent Application Publication No. 2000-293201 (Patent Document 1)
Japanese Registered Patent Publication No. 5526965 (Patent Document 2)
Korean Patent Application Publication No. 2016-0041495 (Patent Document 3)

SUMMARY

Technical Problem

The present invention has been made in view of the above problems, and it is an object of the present invention to provide a circuit capable of individually diagnosing abnormality of a plurality of internal FETs constituting a MOSFET provided between a secondary battery pack and an electric vehicle having the secondary battery pack therein and a method of diagnosing abnormality of the internal FETs using the same.

It is another object of the present invention to provide a circuit and method capable of individually diagnosing abnormality of both MOSFETs disposed on the battery pack side and MOSFETs disposed on the vehicle side, among two MOSFETs connected to each other in series.

Technical Solution

In order to accomplish the above object, the present invention provides a MOSFET assembly including a plurality of MOSFETs configured to control a supply of power through a connection between a positive terminal of a secondary battery pack to a vehicle, wherein at least two of the plurality of MOSFETs are connected to each other in series, and wherein at least two of the plurality of MOSFETs are in parallel with each other; and a multiplexer (MUX) including a plurality of channels, each channel connected to a gate of a respective MOSFET of the plurality of MOSFETs.

The MOSFET assembly according to the present invention may further include a switch positioned between the positive (+) terminal of the secondary battery pack and the vehicle and in parallel with the plurality of MOSFETs.

The MOSFET assembly according to the present invention may further include a driver positioned at an input end of the MUX; and a microcontroller configured to provide inputs corresponding to a total number of channels necessary to control the MUX.

The MOSFET assembly may be configured such that a first pair of MOSFETs are connected to each other in series, a second pair of MOSFETs are connected to each other in series, and the first and second pairs of MOSFETs are in parallel with each other.

Each pair of MOSFETs may include a first MOSFET on a battery pack side of the MOSFET assembly and a second MOSFET on a vehicle side of the MOSFET assembly. Each first MOSFET may be configured to direct a flow of current therethrough in a direction from the secondary battery pack to the vehicle in response to a voltage being applied to the gate of the first MOSFET, and may include a diode configured to direct a flow of current therethrough in a direction from the vehicle to the secondary battery pack in response to no voltage being applied to the gate of the first MOSFET.

Each second MOSFET may be configured to direct a flow of current therethrough in a direction from the vehicle to the secondary battery pack in response to a voltage being applied to the gate of the second MOSFET, and may include a diode configured to direct a flow of current therethrough in a direction from the secondary battery pack to the vehicle in response to no voltage being applied to the gate of the second MOSFET.

The MOSFETs disposed on the battery pack side and the vehicle side may be symmetric with each other.

The diodes of the first and second MOSFETs may be separately connected to the respective MOSFETs or parasitic diodes disposed in the respective MOSFETs.

The plurality of MOSFETs may be internal MOSFETs configured to collectively operate as a single MOSFET, and the MOSFET assembly may be controlled by a battery management system (BMS) of the secondary battery pack.

In addition, the present invention provides a method of determining abnormality of individual MOSFETs among a plurality of MOSFETs included in a MOSFET assembly configured to control a supply of power from a positive terminal of a secondary battery pack to a vehicle, wherein at least two individual MOSFETs of the plurality of MOSFETs are connected to each other in series, and wherein at least two individual MOSFETs of the plurality of MOSFETs are in parallel with each other, and wherein each individual MOSFET includes a respective gate connected to a corresponding channel of a MUX, the method including for each individual MOSFET of the plurality of MOSFETs, measuring a voltage at both ends of the individual MOSFET while sequentially turning ON/OFF the channels of the MUX. The method may further include measuring voltage at both ends of the MOSFET assembly. In the method, the MOSFET assembly may be configured such that a first pair of MOSFETs are connected to each other in series, a second pair of MOSFETs are connected to each other in series, and the first and second pairs of MOSFETs are in parallel with each other, wherein each pair of MOSFETs includes a first MOSFET on a battery pack side of the MOSFET assembly and a second MOSFET on a vehicle side of the MOSFET assembly, and the method may further include determining abnormality of a first MOSFET based on a current supplied from the battery pack.

In addition, the present invention provides a method of determining abnormality of individual MOSFETs among a plurality of MOSFET pairs included in a MOSFET assembly configured to control a supply of power from a positive terminal of a secondary battery pack to a vehicle, wherein each MOSFET pair includes a first MOSFET on a battery pack side of the MOSFET assembly and a second MOSFET on a vehicle side of the MOSFET assembly, wherein the MOSFET pairs of the plurality of MOSFETs are in parallel with each other, and wherein each individual MOSFET includes a respective gate connected to a corresponding channel of a MUX, the method including 1) 1) turning a switch OFF, wherein the switch is positioned between the positive terminal of the secondary battery pack and the vehicle and in parallel with the plurality of MOSFETs, 2) while the switch is OFF, for each individual MOSFET of the plurality of MOSFETs, measuring a voltage at both ends of the individual MOSFET while sequentially turning ON/OFF only channels of the MUX configured to control first MOSFETs, 3) turning the switch ON, and 4) while the switch is ON, for each individual MOSFET of the plurality of MOSFETs, measuring the voltage at both ends of the individual MOSFET while sequentially turning ON/OFF only channels of the MUX configured to control second MOSFETs. The method may further include measuring voltage at both ends of the MOSFET assembly while the switch is OFF and while the switch is ON.

The method may further include comparing values of the measured voltages of each of the individual MOSFETs; and determining abnormality of one or more individual MOSFETs based on the comparison.

The present invention may be provided in the state in which arbitrary combinations of the above invention are possible.

BRIEF DESCRIPTION OF THE DRAWINGS

FIG. 1 is a connection circuit diagram of conventional MOSFETs for vehicles.

FIG. 2 is a partial modification of the connection circuit diagram of the conventional MOSFETs for vehicles.

FIG. 3 is a connection circuit diagram of MOSFETs for vehicles according to a first embodiment of the present invention.

FIG. 4 is a connection circuit diagram of MOSFETs for vehicles according to a second embodiment of the present invention.

DETAILED DESCRIPTION

Now, preferred embodiments of the present invention will be described in detail with reference to the accompanying drawings such that the preferred embodiments of the present invention can be easily implemented by a person having ordinary skill in the art to which the present invention pertains. In describing the principle of operation of the preferred embodiments of the present invention in detail, however, a detailed description of known functions and configurations incorporated herein will be omitted when the same may obscure the subject matter of the present invention.

In addition, the same reference numbers will be used throughout the drawings to refer to parts that perform similar functions or operations. In the case in which one part is said to be connected to another part in the entire specification, not only may the one part be directly connected to the other part, but also, the one part may be indirectly connected to the other part via a further part. In addition, that a certain element is included does not mean that other elements are excluded, but means that such elements may be further included unless mentioned otherwise.

Hereinafter, the present invention will be described in more detail.

FIG. 2 is a partial modification of the connection circuit diagram of the conventional MOSFETs for vehicles.

In the present invention, a portion of the connection circuit diagram of the conventional MOSFETs for vehicles is changed in order to determine abnormality of individual MOSFETs. In FIG. 1, V2, V3, and V4 are connected to each other. In the present invention, however, V2, V3, and V4 are short-circuited, whereby the connection circuit diagram of the MOSFETs is changed such that two individual MOSFETs are connected to each other in series and a plurality of pairs of two individual MOSFETs is connected to each other in parallel.

FIG. 3 is a connection circuit diagram of MOSFETs for vehicles according to a first embodiment of the present invention, and FIG. 4 is a connection circuit diagram of MOSFETs for vehicles according to a second embodiment of the present invention. Hereinafter, the present invention will be described with reference to FIGS. 3 and 4.

In the specification of the present application including FIGS. 1 to 4, the term "FET" indicates a MOSFET for power supply.

The present invention relates to a MOSFET assembly configured such that a plurality of MOSFETs (FET1 to FET6) configured to control connection between a positive (+) terminal of a secondary battery pack, configured to supply power to a vehicle, and the vehicle, configured to receive the power from the secondary battery pack, is connected to each other in series and in parallel. Here, connection points of the vehicle are denoted by V6 and V7.

FET1 to FET6 indicate six internal FETs. An N-type MOSFET or a P-type MOSFET is possible as needed. In all figures of the present invention, only N-type MOSFETs are shown; however, substitution of P-type MOSFETs for N-type MOSFETs is easily selectable as needed.

In the case in which no voltage is applied to gates, FET1, FET2, and FET3 are operated differently from FET4, FET5, and FET6. In the case in which voltage is applied to the gates, current may flow through FET1, FET2, and FET3 in a direction from the battery pack to the vehicle. In the case in which no voltage is applied to the gates, current flows through diodes in a direction from the vehicle to the battery pack. In the case in which voltage is applied to the gates, current may flow through FET4, FET5, and FET6 in the direction from the vehicle to the battery pack, in contrast to FET1, FET2, and FET3. In the case in which no voltage is applied to the gates, current flows through diodes in the direction from the battery pack to the vehicle.

Six MUXs connected to the gates of the MOSFETs of the MOSFET assembly have a total of six channels CH1, CH2, CH3, CH4, CH5, and CH6, and the channels are controlled by control signals S0, S1, and S2 sent by a microcontroller unit (MCU).

A driver module, which is an input end of the MUX, is also connected to the MUX.

CH7 may be further added to the MUX. In the case in which no diagnosis is performed, normal operation may be performed through CH7, which is capable of collectively controlling all of the FETs, and switches. In FIG. 3, FET1, FET2, and FET3 may be continuously maintained ON by CH7. At this time, the other channels, i.e. CH1 to CH6, are OFF.

In the MOSFET assembly, two MOSFETs are connected to each other in series, and two or more pairs of two MOSFETs connected to each other in series are connected to each other in parallel.

Diodes, configured to allow current to flow therethrough in the direction from the vehicle to the battery pack in the case in which no voltage is applied to the gates, are provided at the MOSFETs (FET1, FET2, and FET3) disposed on the battery pack side, among the two MOSFETs connected to each other in series.

Diodes, configured to allow current to flow therethrough in the direction from the battery pack to the vehicle in the case in which no voltage is applied to the gates, are provided at the MOSFETs (FET4, FET5, and FET6) disposed on the vehicle side, among the two MOSFETs connected to each other in series.

The diodes may be separately connected diodes or parasitic diodes disposed in the MOSFETs.

A method of determining abnormality of individual MOSFETs using the MOSFET assembly for vehicle according to the first embodiment of the present invention includes:

a step of measuring voltage at both ends of each individual MOSFET while sequentially turning ON/OFF the channels of the MUX.

The method may further include a step of measuring voltage at both ends of all individual MOSFETs.

In the case in which a certain channel is turned ON by the MUX, the ON channel generates a signal, whereby an FET corresponding thereto is operated. In the case in which CH1 is turned ON, voltage is applied only to the gate of FET1. For example, on the assumption that voltage of the battery pack is 48 V and FET1 is normally operated, each of V1, V2, and V5 is 48 V while each of V3 and V4 is 0 V in the case in which only FET1 is turned ON. In the case in which FET1 is continuously maintained ON (fail on or short), each of V1, V2, and V5 is 48 V even though all of the FETs are turned OFF. In the case in which FET1 is continuously maintained OFF (fail off), only V1 is 48 V even though only FET1 is turned ON.

A diagnosis table for FET1 is shown below.

| Mode | Test Mode | V1 [V] | V2 [V] | V3 [V] | V4 [V] | V5 [V] |
| --- | --- | --- | --- | --- | --- | --- |
| Normal | FET1 only ON | 48 | 48 | 0 | 0 | 48 |
| FET1 open | | 48 | 0 | 0 | 0 | 0 |
| Normal | All OFF | 48 | 0 | 0 | 0 | 0 |
| FET1 short | | 48 | 48 | 0 | 0 | 48 |

It is possible to determine abnormality of FET1, FET2, and FET3 using the above method. For FET2 and FET3, values corresponding to V2 are replaced by V3 and V4, respectively.

The connection circuit diagram of MOSFETs for vehicles according to the second embodiment of the present invention further includes an additional parallel connection including a switch SW1 provided between the positive (+) terminal of the secondary battery pack and the vehicle, configured to receive power from the secondary battery pack, compared to the first embodiment. The switch SW1 is connected only for diagnosis.

A method of determining abnormality of individual MOSFETs using the MOSFET assembly for vehicles according to the second embodiment of the present invention includes:

1) a step of turning the switch OFF;
2) a step of measuring voltage at both ends of each individual MOSFET while sequentially turning ON/OFF only channels configured to control MOSFETs disposed on the battery pack side, among the channels of the MUX;
3) a step of turning the switch ON; and
4) a step of measuring voltage at both ends of each individual MOSFET while sequentially turning ON/OFF only channels configured to control MOSFETs disposed on the vehicle side, among the channels of the MUX.

The method may further include a step of measuring voltage at both ends of all individual MOSFETs in each of step 2) and step 4).

In the case in which a certain channel is turned ON by the MUX, the ON channel generates a signal, whereby an FET corresponding thereto is operated. In the case in which CH1 is turned ON, voltage is applied only to the gate of FET1. For example, on the assumption that voltage of the battery pack is 48 V and FET1 is normally operated, each of V1, V2, and V5 is 48 V while each of V3 and V4 is 0 V in the case in which only FET1 is turned ON. In the case in which FET1 is continuously maintained ON (fail on or short), each of V1, V2, and V5 is 48 V even though all of the FETs are turned OFF. In the case in which FET1 is continuously maintained OFF (fail off), only V1 is 48 V even though only FET1 is turned ON.

In the opposite case, a voltage of 48 V is also applied to V5 when SW is turned ON. In the case in which CH4 is turned ON, voltage is applied only to the gate of FET4. For example, on the assumption that voltage of the battery pack is 48 V and FET4 is normally operated, each of V1, V2, and V5 is 48 V while each of V3 and V4 is 0 V in the case in which only FET4 is turned ON. In the case in which FET4 is continuously maintained ON (fail on or short), each of V1, V2, and V5 is 48 V even though all of the FETs are turned OFF. In the case in which FET4 is continuously maintained OFF (fail off), only each of V1 and V5 is 48 V even though only FET4 is turned ON.

A diagnosis table for FET1 and FET4 is shown below.

| Mode | Test Mode | V1 [V] | V2 [V] | V3 [V] | V4 [V] | V5 [V] |
|---|---|---|---|---|---|---|
| Normal | FET1 only ON | 48 | 48 | 0 | 0 | 48 |
| FET1 open | | 48 | 0 | 0 | 0 | 0 |
| Normal | All OFF | 48 | 0 | 0 | 0 | 0 |
| FET1 short | | 48 | 48 | 0 | 0 | 48 |
| Normal | 1. FET4 only ON | 48 | 48 | 0 | 0 | 48 |
| FET4open | 2. SW1 ON | 48 | 0 | 0 | 0 | 48 |
| Normal | 1. All OFF | 48 | 0 | 0 | 0 | 48 |
| FET4short | 2. SW1 ON | 48 | 48 | 0 | 0 | 48 |

It is possible to determine abnormality of FET1, FET2, FET3, FET4, FET5, and FET6 using the above method. For FET2 and FET3 and FET5 and FET6, values corresponding to V2 are replaced by V3 and V4, respectively.

FIGS. 3 and 4 diagrammatically show two series connections and three parallel connections thereof. In the case in which a plurality of series connections is used instead of the two series connections, however, the solution principle of the present invention is equally applicable, and therefore the above structure must also be included in the scope of right of the present invention.

Although the specific details of the present invention have been described in detail, those skilled in the art will appreciate that the detailed description thereof discloses only preferred embodiments of the present invention and thus does not limit the scope of the present invention. Accordingly, those skilled in the art will appreciate that various changes and modifications are possible, without departing from the category and the technical idea of the present invention, and it will be obvious that such changes and modifications fall within the scope of the appended claims.

DESCRIPTION OF REFERENCE SYMBOLS

10: Connection circuit diagram of conventional MOSFETs for vehicles
20: Partial modification of connection circuit diagram of conventional MOSFETs for vehicles
30: Connection circuit diagram of MOSFETs for vehicles according to first embodiment of present invention
40: Connection circuit diagram of MOSFETs for vehicles according to second embodiment of present invention
BAT: Secondary battery pack
V1, V2, V3, V4, V5, V6, V7: Voltage measurement points
FET1, FET2, FET3, FET4, FET5, FET6: Internal FETs
DRIVER: Driver
MCU: Microcontroller unit
CH1, CH2, CH3, CH4, CH5, CH6, CH7: Control channels of MUX
CTRL: Transmission signal input portion of drive unit
S0, S1, S3: Control signal input portion of microcontroller unit

INDUSTRIAL APPLICABILITY

As is apparent from the above description, the present invention has an advantage in that, in an electric vehicle having a secondary battery pack, it is possible to individually diagnose abnormality of a plurality of internal FETs constituting a MOSFET provided between the secondary battery pack and the electric vehicle. As a result, the present invention is capable of providing a power system having higher safety than a conventional MOSFET assembly.

The invention claimed is:

1. A MOSFET assembly comprising:
   a plurality of MOSFETs configured to control a supply of power through a connection between a positive terminal of a secondary battery pack to a vehicle, wherein plurality of MOSFETs includes at least a first pair of MOSFETs connected to each other in series along a first path and a second pair of MOSFETs connected to each other in series along a second path, and wherein the first path and the second path are in parallel with each other; and
   a multiplexer (MUX) including a plurality of channels, each channel connected to a gate of a respective MOSFET of the plurality of MOSFETs.

2. The MOSFET assembly according to claim 1, further comprising a switch positioned between the positive terminal of the secondary battery pack and the vehicle and in parallel with the plurality of MOSFETs.

3. The MOSFET assembly according to claim 1, further comprising:
   a MOSFET driver positioned at an input end of the MUX; and
   a microcontroller configured to provide inputs corresponding to a total number of channels necessary to control the MUX.

4. The MOSFET assembly according to claim 1, wherein each pair of MOSFETs includes a first MOSFET on a battery pack side of the MOSFET assembly and a second MOSFET on a vehicle side of the MOSFET assembly,
   wherein each first MOSFET is configured to direct a flow of current therethrough in a direction from the secondary battery pack to the vehicle in response to a voltage being applied to the gate of the first MOSFET, and includes a diode configured to direct a flow of current therethrough in a direction from the vehicle to the secondary battery pack in response to no voltage being applied to the gate of the first MOSFET, and
   wherein each second MOSFET is configured to direct a flow of current therethrough in the direction from the vehicle to the secondary battery pack in response to a voltage being applied to a gate of the second MOSFET, and includes a diode configured to direct the flow of current therethrough in the direction from the secondary battery pack to the vehicle in response to no voltage being applied to the gate of the second MOSFET.

5. The MOSFET assembly according to claim 4, wherein the diodes of the first and second MOSFETs are separately connected to the respective MOSFETs or are parasitic diodes disposed in the respective MOSFETs.

6. The MOSFET assembly according to claim 1, wherein the plurality of MOSFETs are internal MOSFETs configured to collectively operate as a single MOSFET.

7. The MOSFET assembly according to claim 1, wherein the MOSFET assembly is controlled by a battery management system (BMS) of the secondary battery pack.

8. A method of determining abnormality of individual MOSFETs among a plurality of MOSFETs included in a MOSFET assembly configured to control a supply of power from a positive terminal of a secondary battery pack to a vehicle, wherein the plurality of MOSFETs includes at least a first pair of MOSFETs connected to each other in series along a first path and a second pair of MOSFETs connected to each other in series along a second path, and wherein the first path and the second path are in parallel with each other, and wherein each individual MOSFET includes a respective gate connected to a corresponding channel of a MUX, the method comprising:

for each individual MOSFET of the plurality of MOSFETs, measuring a voltage at both ends of the individual MOSFET while sequentially turning ON/OFF the channels of the MUX.

9. A method of determining abnormality of individual MOSFETs among a plurality of MOSFET pairs included in a MOSFET assembly configured to control a supply of power from a positive terminal of a secondary battery pack to a vehicle, wherein each MOSFET pair includes a first MOSFET on a battery pack side of the MOSFET assembly and a second MOSFET on a vehicle side of the MOSFET assembly, wherein the MOSFET pairs of the plurality of MOSFETs are in parallel with each other, and wherein each individual MOSFET includes a respective gate connected to a corresponding channel of a MUX, the method comprising:

1) turning a switch OFF, wherein the switch is positioned between the positive terminal of the secondary battery pack and the vehicle and in parallel with the plurality of MOSFETs;

2) while the switch is OFF, for each individual MOSFET of the plurality of MOSFETs, measuring a voltage at both ends of the individual MOSFET while sequentially turning ON/OFF only channels of the MUX configured to control first MOSFETs;

3) turning the switch ON; and 4) while the switch is ON, for each individual MOSFET of the plurality of MOSFETs, measuring the voltage at both ends of the individual MOSFET while sequentially turning ON/OFF only channels of the MUX configured to control second MOSFETs.

10. The method according to claim 8, further comprising measuring voltage at both ends of the MOSFET assembly.

11. The method according to claim 9, further comprising measuring voltage at both ends of the MOSFET assembly while the switch is OFF and while the switch is ON.

12. The method according to claim 8, further comprising:

comparing values of the measured voltages of each of the individual MOSFETs; and determining abnormality of one or more individual MOSFETs based on the comparison.

13. The method according to claim 8, wherein the MOSFET assembly is configured such that a first pair of MOSFETs are connected to each other in series, a second pair of MOSFETs are connected to each other in series, and the first and second pairs of MOSFETs are in parallel with each other, wherein each pair of MOSFETs includes a first MOSFET on a battery pack side of the MOSFET assembly and a second MOSFET on a vehicle side of the MOSFET assembly, and the method further comprises determining abnormality of a first MOSFET based on a current supplied from the battery pack.

* * * * *